(12) United States Patent
Aleksić et al.

(10) Patent No.: US 10,404,258 B2
(45) Date of Patent: *Sep. 3, 2019

(54) INTEGRATED CIRCUIT DEVICE HAVING AN INJECTION-LOCKED OSCILLATOR

(71) Applicant: Rambus Inc., Sunnyvale, CA (US)

(72) Inventors: Marko Aleksić, Mountain View, CA (US); Brian S. Leibowitz, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 8 days.

This patent is subject to a terminal disclaimer.

(21) Appl. No.: 15/796,608

(22) Filed: Oct. 27, 2017

(65) Prior Publication Data

US 2018/0145693 A1 May 24, 2018

Related U.S. Application Data

(63) Continuation of application No. 15/009,485, filed on Jan. 28, 2016, now Pat. No. 9,859,899, which is a continuation of application No. 13/988,615, filed as application No. PCT/US2011/060215 on Nov. 10, 2011, now Pat. No. 9,287,880.

(60) Provisional application No. 61/419,459, filed on Dec. 3, 2010.

(51) Int. Cl.
| | |
|---|---|
| *H03B 5/08* | (2006.01) |
| *H03B 5/18* | (2006.01) |
| *H03L 1/00* | (2006.01) |
| *H03L 7/24* | (2006.01) |
| *H03K 3/03* | (2006.01) |
| *H03L 7/083* | (2006.01) |

(52) U.S. Cl.
CPC .............. *H03L 1/00* (2013.01); *H03K 3/0315* (2013.01); *H03L 7/24* (2013.01); *H03L 7/083* (2013.01)

(58) Field of Classification Search
CPC .. H03L 1/00; H03L 7/24; H03L 7/083; H03K 3/0315
USPC ......................................................... 331/173
See application file for complete search history.

(56) References Cited

U.S. PATENT DOCUMENTS

| | | |
|---|---|---|
| 6,717,481 B2 | 4/2004 | Aikawa et al. |
| 7,557,664 B1 | 7/2009 | Wu |
| 7,592,875 B2 | 9/2009 | Maget et al. |
| 7,710,210 B2 | 5/2010 | Casper et al. |

(Continued)

OTHER PUBLICATIONS

Adler, Robert, "A Study of Locking Phenomena in Oscillators," Jun. 1946, Proceedings of the I.R.E. and Waves and Electrons, p. 351-357. 7 pages.

(Continued)

*Primary Examiner* — Richard Tan
(74) *Attorney, Agent, or Firm* — Park, Vaughan, Fleming & Dowler LLP; Laxman Sahasrabuddhe

(57) ABSTRACT

A variable injection-strength injection-locked oscillator (ILO) is described. The variable injection-strength ILO can output an output clock signal based on an input clock signal. The variable injection-strength ILO can pause, restart, slow down, or speed up the output clock signal synchronously with respect to the input clock signal in response to receiving power mode information. Specifically, the variable injection-strength ILO can be operated under relatively strong injection when the input clock signal is paused, restarted, slowed down, or sped up.

20 Claims, 7 Drawing Sheets

(56) References Cited

U.S. PATENT DOCUMENTS

| | | | |
|---|---|---|---|
| 9,287,880 B2* | 3/2016 | Aleksic | H03K 3/0315 |
| 2003/0076178 A1 | 4/2003 | Aikawa et al. | |
| 2008/0189563 A1 | 8/2008 | Itkin | |
| 2009/0167441 A1 | 7/2009 | Song et al. | |
| 2009/0175116 A1 | 7/2009 | Song et al. | |
| 2010/0085123 A1 | 4/2010 | Frans et al. | |

OTHER PUBLICATIONS

Carusone, Tony Chan, "Injection-Locking for High-Speed Wireline Communication," University of Toronto, Apr. 15, 2010. 14 pages.

Casper et al., "A 20Gb/s Forwarded Clock Transceiver in 90nm CMOS," 4.6, ISSCC 2006 Session 4. 10 pages.

Farjad-Rad, Ramin et al., "A 33-mW 8-Gb/s CMOS Clock Multiplier and CDR for Highly Integrated I/Os," IEEE Journal of Solid-State Circuits, vol. 39, No. 9, Sep. 2004, pp. 1553-1561. 9 pages.

Hossain, et al., "5-10 Gb/s 70 mW Burst Mode AC Coupled Receiver in 90-nm CMOS," IEEE Journal of Solid-State Circuits, vol. 45, No. 3, Mar. 2010, p. 524-537. 14 pages.

Hossain, Masum et al., "A 6.8mW 7.4Gb/s Clock-Forwarded Receiver with up to 300MHz Jitter Tracking in 65nm CMOS," ISSCC 2010, Session 8, High-Speed Wireline Transceivers 8 2, p. 158-160. 3 pages.

Hossain, Masum et al., "CMOS Oscillators for Clock Distribution and Injection-Locked Deskew," IEEE Journal of Solid-State Circuits, vol. 44, No. 8, pp. 2138-2153, Aug. 2009. 16 pages.

Hu et al., "A 0.6mW/Gbps, 6.4-8.0Gbps Serial Link Receiver/sing Local Injection-Locked Ring Oscillators in 90nm CMOS," 2009 Symposium on VLSI Circuits Digest of Technical Papers. 2 pages.

Hu, Kangmin et al., "A 0.6 mW/Gb/s, 6.4-7.2 Gb/s Serial Link Receiver Using Local Injection-Locked Ring Oscillators in 90 nm CMOS," IEEE Journal of Solid-State Circuits, vol. 45, No. 4, Apr. 2010, pp. 899-908. 10 pages.

International Preliminary Report on Patentability (Chapter I) dated Jun. 13, 2013 in international Application No. PCT/US2011/060215. 8 pages.

International Search Report and Written Opinion dated Jun. 22, 2012 in International Application No. PCT/US2011/060215. 10 pages.

Jaussi et al., "A 20Gb/s Embedded Clock Transceiver in 90nm CMOS," 18.8, ISSCC 2006 Session 18. 10 pages.

Lai et al., "Capturing Oscillator Injection Locking via Nonlinear Phase-Domain Macromodels," IEEE Transactions on Microwave Theory and Techniques, vol. 52, No. 9, Sep. 2004, p. 2251-2261. 11 paces.

Lee, Jri et al., "Paper 5.2: Subharmonically Injection-Locked PLLs for Ultra-Low-Noise Clock Generation," Slides, 2009 IEEE International Solid-State Circuits Conference. 32 pages.

Lee, Jri et al., "Subharmonically Injection-Locked PLLs for Ultra-Low-Noise Clock Generation," ISSCC 2009, Session 5, 5.2, pp. 91-93. 3 pages.

Maffezzoni, Paolo, "Analysis of Oscillator Injection Locking Through Phase-Domain Impulse-Response," IEEE Transactions on Circuits and Systems—I: Regular Papers, vol. 55, No. 5, Jun. 2008, p. 1297-1305. 9 pages.

Mahony et al., "A 27Gb/s Forwarded-Clock I/O Receiver Using an Injection-Locked LC-DCO in 45nm CMOS," 25.1, ISSCC 2008 Session 25, p. 452-453, 627. 3 pages.

Mirzaei, Ahmad et al., "Multi-Phase Injection Widens Lock Range of Ring-Oscillator-Based Frequency Dividers," IEEE Journal of Solid-State Circuits, vol. 43, No. 3, Mar. 2008, pp. 656-671. 16 pages.

Ng et al. "A Second-Order Semidigital Clock Recovery Circuit Based on Injection Locking", IEEE Journal of Solid-State Circuits, vol. 38 No. 12, Dec. 2003, pp. 2101-2110, plus corresponding ISSCC 2003 Session 4 paper 4.3. 18 pages.

O'Mahony et al., "Paper 25.1: A 27Gb/s Forwarded-Clock I/O Receiver using an Injection-Locked LC-DCO in 45nm CMOS," IEEE International Solid-State Circuits 2008. 39 pages.

O'Mahony, Frank et al. "A Programmable Phase Rotator based on Time-Modulated Injection-Locking" 2010 IEEE Symposium on VLSI Circuits (VLSIC), Honolulu, HI, Jun. 16-18, 2010, pp. 45-46. 2 pages.

Paciorek, L.J., "Injection Locking of Oscillators" Nov. 1965, Proceedings of the IEEE, vol. 53, No. 11, p. 1723-1728. 6 pages.

Rategh, H.R., et al., "Superharmonic Injection-Locked Frequency Dividers," IEEE Journal of Solid-State Circuits, 34(6): 813-821 (Jun. 1999). 9 pages.

Razavi, Behzad, "A Study of Injection Locking and Pulling in Oscillators," IEEE Journal of Solid-State Circuits, vol. 39, No. 9, Sep. 2004, p. 1415-1424. 10 pages.

Shekhar, Sudip et al., "Strong Injection Locking in Low-Q LC Oscillators: Modeling and Application in a Forwarded-Clock I/O receiver," IEEE Transactions on Circuits and Systems—I: Regular Papers, vol. 56, No. 8, Aug. 2009, pp. 1818-1829. 12 pages.

Vanassche, et al., "On the Difference between Two Widely Publicized Methods for Analyzing Oscillator Phase Behavior," 2002, IEEE, p. 229-233. 5 pages.

Zhang, Lin et al., "Injection-Locked Clocking: A New GHz Clock Distribution Scheme," IEEE 2006 Custom Integrated Circuits Conference (CICC), pp. 785-788. 4 pages.

* cited by examiner

INTEGRATED CIRCUIT DEVICE HAVING AN INJECTION-LOCKED OSCILLATOR

RELATED APPLICATION

This application is a continuation of, and claims priority to, U.S. patent application Ser. No. 15/009,485, having the same title and inventors as the Instant Application, filed on 28 Jan. 2016, which is herein incorporated by reference in its entirety for all purposes. U.S. application Ser. No. 15/009,485, is a continuation of U.S. patent application Ser. No. 13/988,615 (U.S. Pat. No. 9,287,880, issued 15 Mar. 2016), having the same title and inventors as the Instant Application, filed on 21 May 2013, which is herein incorporated by reference in its entirety for all purposes. U.S. patent application Ser. No. 13/988,615 is a national stage application of, and claims priority to, International Patent Application no. PCT/US11/60215, having the same title and inventors as the Instant Application, filed on 10 Nov. 2011, which is herein incorporated by reference in its entirety for all purposes. International Application No. PCT/US11/60215 claims benefit of U.S. Provisional Application No. 61/419,459, having the same title and inventors as the Instant Application, filed on 3 Dec. 2010, which is herein incorporated by reference in its entirety for all purposes.

BACKGROUND

Field

This disclosure relates to electronic circuits. More specifically, this disclosure generally relates to an injection-locked oscillator (ILO), for example, in an integrated circuit device.

Related Art

The mobile computing revolution has enhanced the efficiency in how people communicate and interact with one another. Mobile devices are usually designed to meet stringent power constraints so that they can operate on batteries for a reasonably long time. To reduce power consumption, mobile devices may use circuits that have multiple power modes. Specifically, a mobile device may need to transition a circuit rapidly from one power mode to another power mode.

Some circuits may not be suitable for use in devices that have multiple power modes, especially if the circuits need to be transitioned rapidly from one power mode to another power mode. Further, in some circuits, latency may be incurred when recovering from power down modes. Specifically, powering up an ILO can create unpredictable transients in the ILO's output clock signal. Furthermore, latching and unlatching the ILO's output clock signal synchronously with respect to the input clock signal is not practical at high clock frequencies.

DETAILED DESCRIPTION

Embodiments presented in this disclosure are directed to methods and apparatuses featuring an injection-locked oscillator (ILO) whose injection strength can be varied based on power mode information. In this disclosure, unless otherwise stated, the phrase "based on" means "based solely or partly on."

Figure 1:
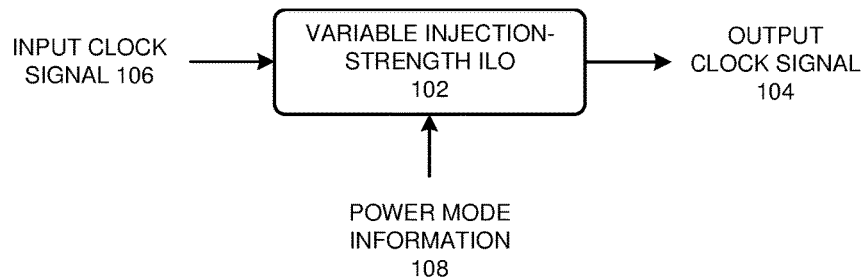
FIG. 1 illustrates a variable injection-strength injection-locked oscillator in accordance with some embodiments described in this disclosure.

FIG. 1 illustrates a variable injection-strength ILO in accordance with some embodiments described in this disclosure. Variable injection-strength ILO 102 outputs output clock signal 104 based on input clock signal 106. In general, the methods and apparatuses described in this disclosure are applicable to any system that uses one or more ILOs.

An integrated circuit device, or circuits contained in such a device, can have multiple power modes. In some embodiments described in this disclosure, the integrated circuit device, or the circuits contained in the device, can transition rapidly from one power mode to another power mode. In a normal power mode, one or more parts of a circuit may be clocked using a clock signal that is operating at a normal clock frequency. In a power saving mode, the clock signal may be paused and/or the frequency of the clock signal may be substantially reduced in one or more parts of the circuit to reduce the dynamic power consumption of the circuit. Note that a circuit can have multiple power saving modes, e.g., different power saving modes of a circuit may slow down and/or pause the clock in different parts of the circuit.

Whenever a circuit transitions from one power mode to another, clock signals may need to be paused, slowed down, restarted, and/or sped up. In some embodiments, a circuit may be calibrated at system startup so that the data signal is sampled in the middle of the data eye. To operate correctly, the circuit may require the clock signal to be cleanly paused and restarted. Some embodiments provide a fast turn-on/turn-off apparatus that can be used to cleanly pause, restart, slow down, or speed up the clock signal.

According to one definition, when a clock signal is cleanly paused, restarted, slowed down, or sped up, the clock signal does not cause unpredictable changes to the circuit state. According to another definition, an output clock signal of an ILO is cleanly paused, restarted, slowed down, or sped up if the output clock signal synchronously tracks the input clock signal as the input clock signal is paused, restarted, slowed down, or sped up. According to one definition, an output clock signal synchronously tracks an input clock signal if each transition in the input clock signal corresponds to exactly one well-defined transition in the output clock signal. Note that these definitions are neither exhaustive nor mutually exclusive.

In an embodiment, the ILO can be based on a tank circuit (i.e., an inductor/capacitor oscillator) or a ring oscillator, with one or more nodes for receiving an input clock signal, and one or more nodes for outputting an output clock signal. In some embodiments, injection locking or injection pulling may occur when the oscillator is perturbed by an input clock signal whose frequency is relatively close to the oscillator's fundamental frequency, or relatively close to a sub-harmonic or a super-harmonic of the oscillator's fundamental frequency.

The behavior of an ILO, in embodiments described herein, may depend on the injection strength. If the injection strength is relatively weak, the oscillator runs relatively autonomously except that the oscillator's frequency and steady-state phase are dictated by the input clock signal once the ILO locks onto the input clock signal. In some embodiments described herein, ILOs are operated under relatively weak injection to remove clock jitter, to de-skew clock signals, and/or to generate clock signals.

In some embodiments, the ILO is operated under relatively strong injection so that the injection signal overcomes the natural oscillation of the ILO. When an ILO is operated under relatively strong injection by an embodiment, the ILO's output clock signal can pause, restart, slow down, and speed up synchronously with respect to the input clock signal when the input clock signal is paused, restarted, slowed down, and sped up, respectively. An embodiment may not operate the ILO under relatively strong injection when the benefits of operating the ILO under relatively weak injection are needed.

In some embodiments, when the circuit transitions from one power mode to another, variable injection-strength ILO 102 can be operated under relatively strong injection so that the output clock signal can be synchronously paused, restarted, slowed down, and/or sped up with respect to the input clock signal. Once the circuit has transitioned to the new power mode, the ILO may be operated under relatively weak injection. In some embodiments, the performance requirements may be such that the benefits of operating the ILO under relatively weak injection are not needed. In these embodiments, the ILO may continue to be operated under relatively strong injection even after the transition to the new power mode has been completed.

Specifically, variable injection-strength ILO 102 can receive power mode information 108, which may indicate that the circuit is transitioning from one power mode to another. For example, variable injection-strength ILO 102 may receive power mode information 108 that indicates that a circuit is about to enter a power saving mode. In response, variable injection-strength ILO 102 may increase the injection strength so that variable injection-strength ILO 102 operates under relatively strong injection. When variable injection-strength ILO 102 is operating under relatively strong injection, input clock signal 106 may pause or the clock frequency of input clock signal 106 may reduce substantially (e.g., halve). If input clock signal 106 pauses, output clock signal 104 may pause synchronously with respect to input clock signal 106. If the clock frequency of input clock signal 106 reduces substantially (e.g., halves), output clock signal 104 may synchronously track input clock signal 106, so that the clock frequency of output clock signal 104 also reduces accordingly.

Subsequently, input clock signal 106 may restart or the clock frequency of input clock signal 106 may increase substantially (e.g., double). If input clock signal 106 restarts, output clock signal 104 may restart synchronously with respect to input clock signal 106. If the clock frequency of input clock signal 106 increases substantially (e.g., doubles), output clock signal 104 may synchronously track input clock signal 106, so that the clock frequency of output clock signal 104 also increases accordingly. Variable injection-strength ILO 102 may then receive power mode information 108 that indicates that the circuit has completed transitioning to a power mode, e.g., a normal power mode. In response, variable injection-strength ILO 102 may decrease the injection strength so that the ILO operates under relatively weak injection.

In some embodiments, the ILO locks onto the input clock signal over a range of frequency values, called the ILO's locking range. In these embodiments, the locking range can be defined as the frequency range over which the output clock signal of the ILO synchronously tracks the input clock signal. According to one definition, the output clock signal synchronously tracks the input clock signal if the frequency of the output clock signal tracks the frequency of the input clock signal. In these embodiments, the phase delay between the output clock signal and the input clock signal may change when the frequency of the input clock signal is changed.

Increasing the injection strength can be viewed as increasing the locking range of variable injection-strength ILO 102. Conversely, decreasing the injection strength can be viewed as decreasing the locking range of variable injection-strength ILO 102.

Variable injection-strength ILO 102 can be viewed as having multiple operating modes, each with a different locking range. For example, variable injection-strength ILO 102 can have a first operating mode, e.g., a normal-locking-range mode, and a second operating mode, e.g., a large-locking-range mode. In the normal-locking-range mode, output clock signal 104 synchronously tracks input clock signal 106 over a normal frequency range, and in the large-locking-range mode, output clock signal 104 synchronously tracks input clock signal 106 over a large frequency range, which is greater than the normal frequency range.

The injection strength in the large-locking-range mode is greater than the injection strength in the normal-locking-range mode. Variable injection-strength ILO 102 can be operated in the normal-locking-range mode when the circuit is operating in a normal power mode. Variable injection-strength ILO 102 can be operated in the large-locking-range mode when the circuit transitions from one power mode to another, e.g., before the input clock signal is paused or slowed down in a power saving mode.

Figure 2A:
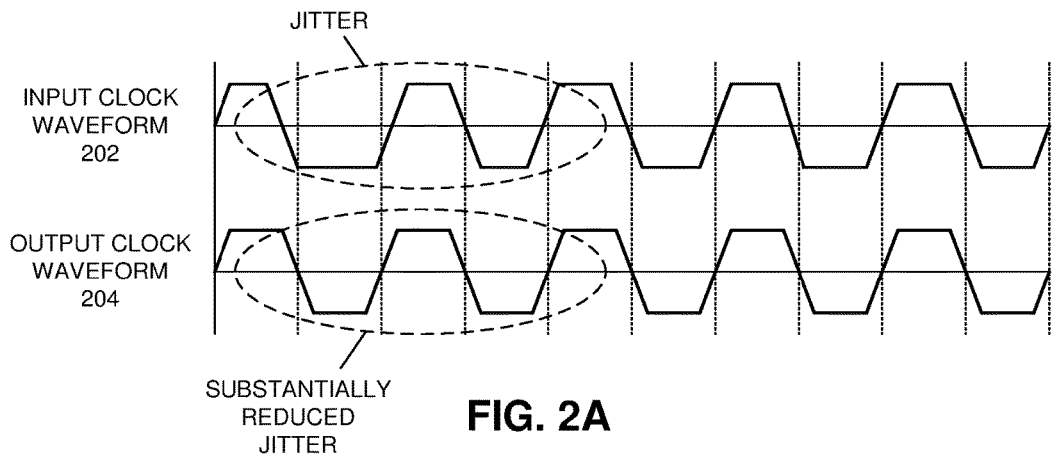
FIGS. 2A-2C illustrate signal waveforms associated with a variable injection-strength ILO operating in a weak-injection-strength mode in accordance with some embodiments described in this disclosure.
Figure 2B:
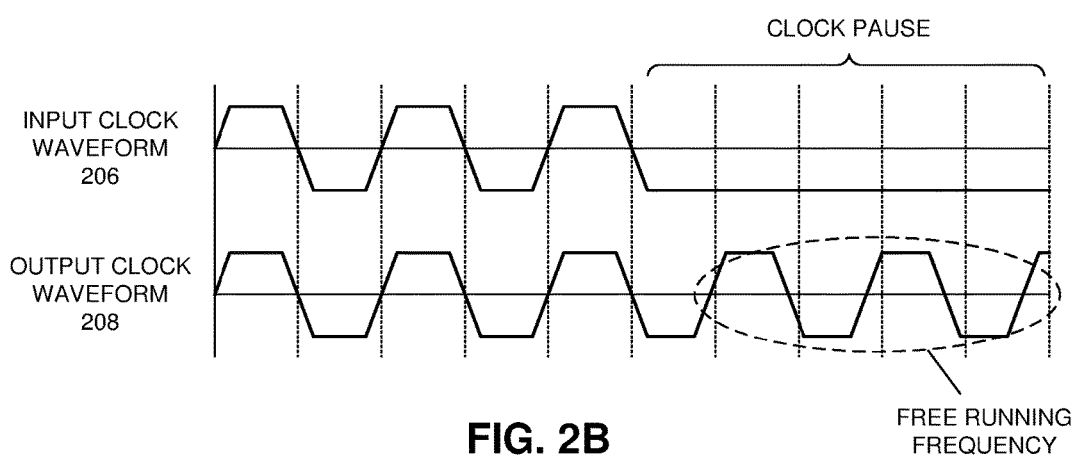
Figure 2C:
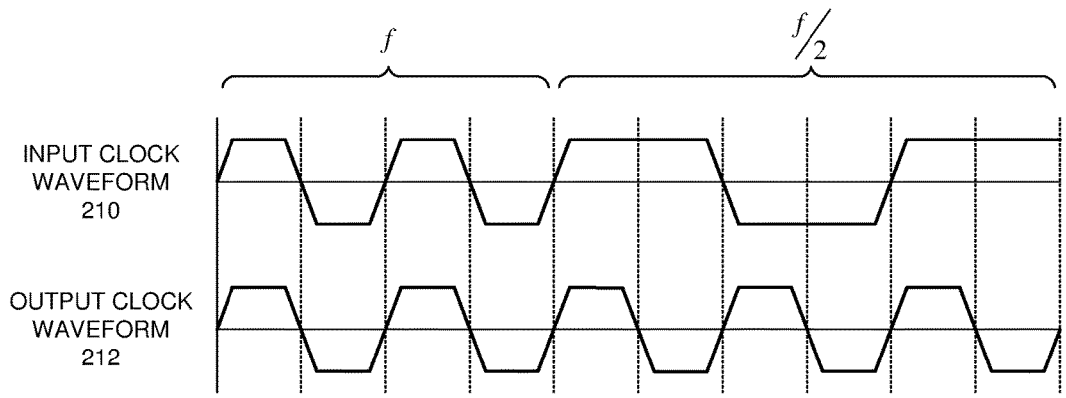

FIGS. 2A-2C illustrate signal waveforms associated with a variable injection-strength ILO operating in a weakinjection-strength mode in accordance with some embodiments described in this disclosure. The signal waveforms shown in FIGS. 2A-2C are for illustration purposes only. Input clock waveforms 202, 206, and 210 can correspond to input clock signal 106. Output clock waveforms 204, 208, and 212 can correspond to output clock signal 104. Output clock waveforms 204, 208, and 212 can have a phase delay with respect to input clock waveforms 202, 206, and 210, respectively. However, phase delays have not been shown in FIGS. 2A-2C for the sake of clarity and ease of discourse.

In a weak-injection-strength mode, a variable injection-strength ILO can substantially reduce jitter from the input clock signal. For example, as shown in FIG. 2A, the jitter in input clock waveform 202 has been removed in output clock waveform 204.

In a weak-injection-strength mode, if the input clock signal is paused, a variable injection-strength ILO may continue outputting an output clock signal whose frequency is approximately equal to the ILO's free-running frequency. For example, as shown in FIG. 2B, output clock waveform 208 toggles at the ILO's free-running frequency even when input clock waveform 206 is paused.

In a weak-injection-strength mode, a variable injection-strength ILO may not lock on the input clock signal if the frequency of the input clock signal is changed substantially. If the ILO does not lock on the input clock signal, it may output a clock signal whose frequency is equal to the ILO's free-running frequency. As shown in FIG. 2C, when the frequency of input clock waveform 210 changes from f to f/2, output clock waveform 212 may continue to output a clock signal at frequency f, although perhaps at a different phase (not shown in FIG. 2C).

Figure 3A:
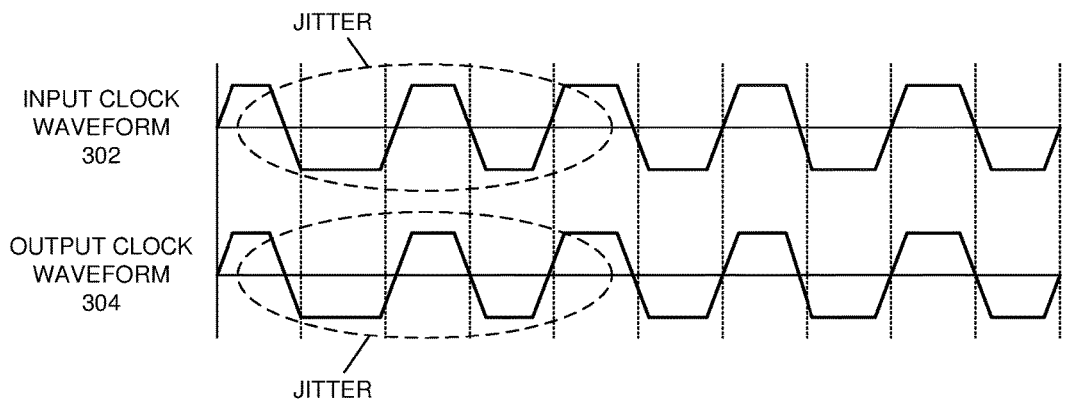
FIGS. 3A-3C illustrate signal waveforms associated with a variable injection-strength ILO operating in a strong-injection-strength mode in accordance with some embodiments described in this disclosure.
Figure 3B:
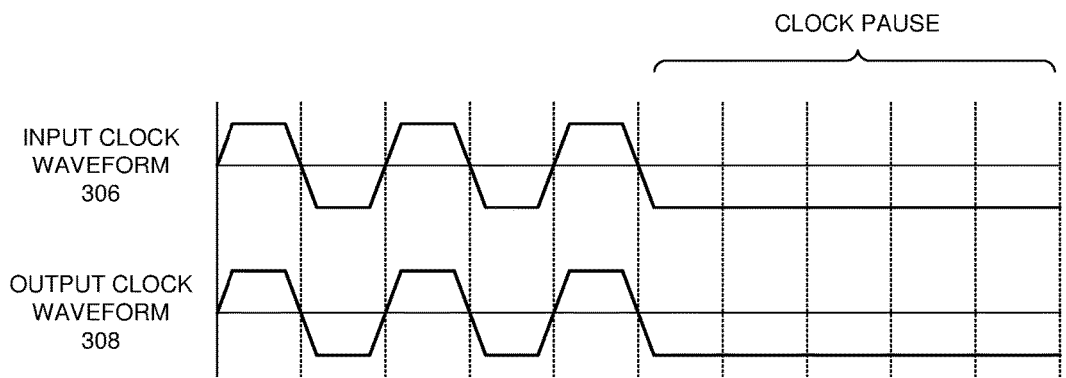
Figure 3C:
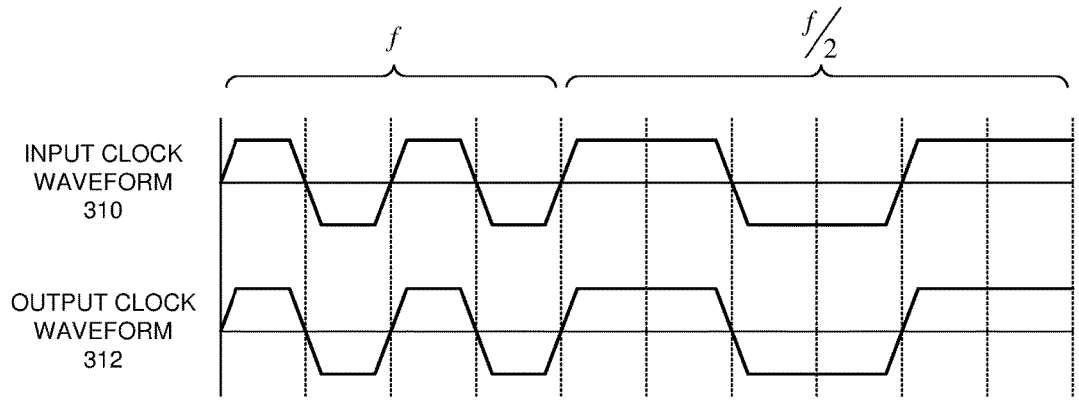

FIGS. 3A-3C illustrate signal waveforms associated with a variable injection-strength ILO operating in a strong-injection-strength mode in accordance with some embodiments described in this disclosure. The signal waveforms shown in FIGS. 3A-3C are for illustration purposes only. Input clock waveforms 302, 306, and 310 can correspond to input clock signal 106. Output clock waveforms 304, 308, and 312 can correspond to output clock signal 104. Output clock waveforms 304, 308, and 312 can have a phase delay with respect to input clock waveforms 302, 306, and 310, respectively. However, phase delays have not been shown in FIGS. 3A-3C for the sake of clarity and ease of discourse.

In comparison to a weak-injection-strength mode, a variable injection-strength ILO operating in a strong-injection-strength mode may not be able to reduce as much jitter from the input clock signal over as wide a range of jitter frequencies. In other words, the variable injection-strength ILO may pass more high frequency jitter from the input clock waveform to the output clock waveform in a strong-injection-strength mode than in a weak-injection-strength mode. For example, as shown in FIG. 3A, the jitter in input clock waveform 302 has been reduced by a much lesser extent in output clock waveform 304.

In a strong-injection-strength mode, if the input clock signal pauses, a variable injection-strength ILO can pause the output clock signal synchronously with respect to the input clock signal. For example, as shown in FIG. 3B, output clock waveform 308 pauses synchronously with respect to input clock waveform 306.

In a strong-injection-strength mode, a variable injection-strength ILO may synchronously track the input clock signal even if the frequency of the input clock signal is changed substantially. For example, as shown in FIG. 3C, output clock waveform 312 synchronously tracks input clock waveform 310 as it changes its frequency from f to f/2.

Figure 4:
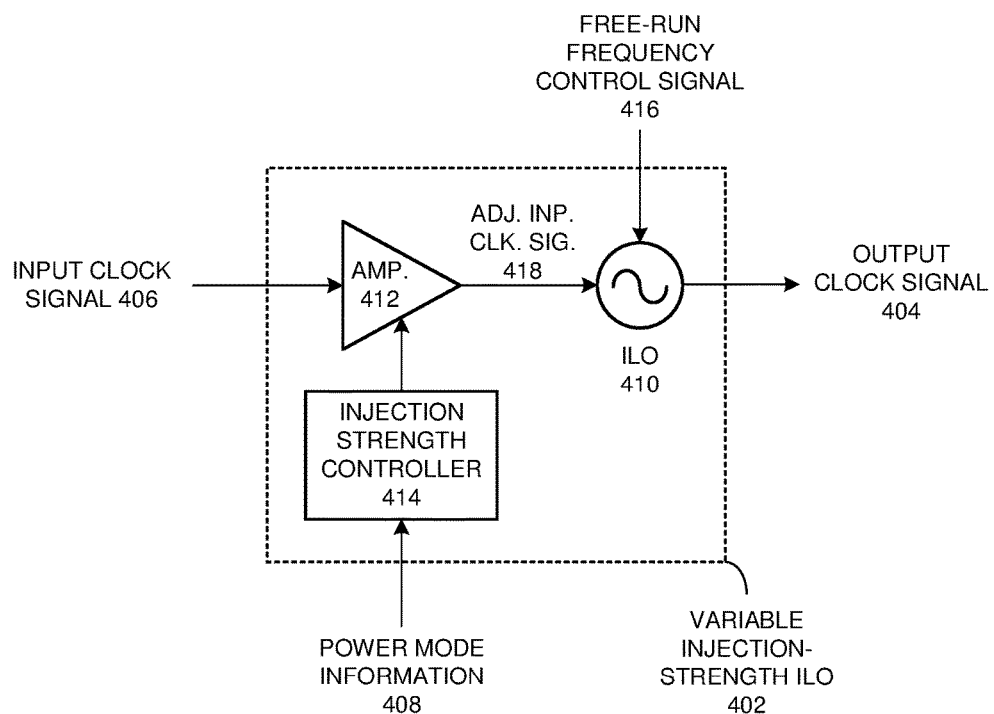
FIG. 4 illustrates a variable injection-strength ILO in accordance with some embodiments described in this disclosure.

FIG. 4 illustrates a variable injection-strength ILO in accordance with some embodiments described in this disclosure. Variable injection-strength ILO 402 is capable of varying the injection strength in response to receiving power mode information 408. Variable injection-strength ILO 402 can include amplifier 412, injection-strength controller 414, and ILO 410. Input clock signal 406 can be amplified by amplifier 412 to produce adjusted input clock signal 418. Adjusted input clock signal 418 can be provided as input to ILO 410, which can produce output clock signal 404. ILO 410 may receive free-run frequency control signal 416, which can be used to control the free-running frequency of an oscillator within ILO 410.

The gain of amplifier 412 can be controlled by injection-strength controller 414. Injection-strength controller 414 can increase the gain of amplifier 412 to operate ILO 410 under relatively strong injection, and decrease the gain of amplifier 412 to operate ILO 410 under relatively weak injection. For example, variable injection-strength ILO 402 may receive power mode information 408 that indicates that a circuit is about to transition between two power modes, e.g., from a normal power mode to a power saving mode. In response, injection-strength controller 414 may increase the gain of amplifier 412 so that ILO 410 operates under relatively strong injection. Subsequently, variable injection-strength ILO 402 may receive power mode information 408 that indicates that a circuit has completed transitioning to a power mode, e.g., a normal power mode. In response, injection-strength controller 414 may decrease the gain of amplifier 412 so that ILO 410 operates under relatively weak injection.

Figure 5:
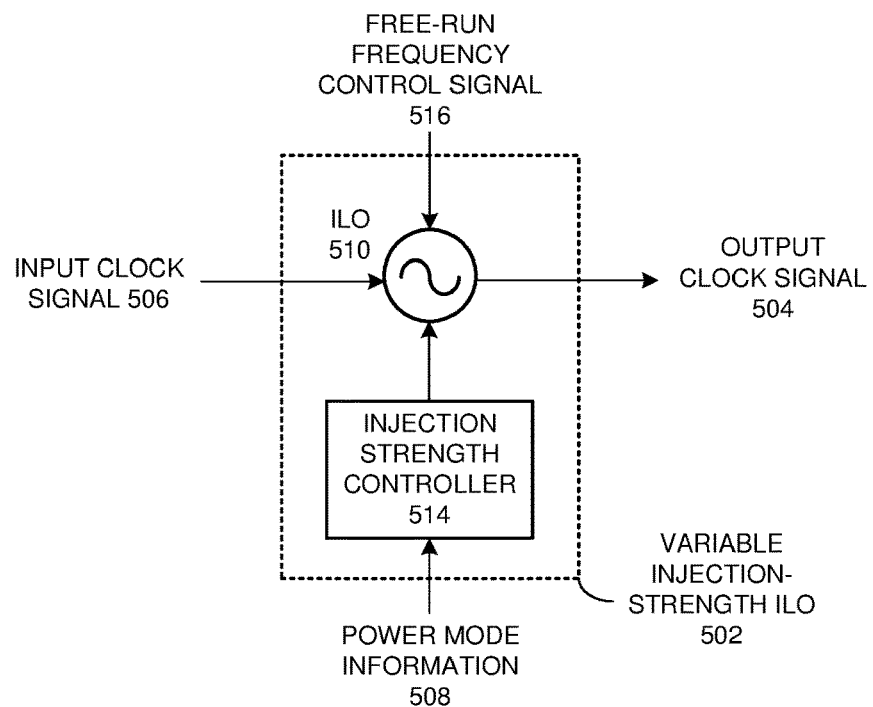
FIG. 5 illustrates a variable injection-strength ILO in accordance with some embodiments described in this disclosure.

FIG. 5 illustrates a variable injection-strength ILO in accordance with some embodiments described in this disclosure. Variable injection-strength ILO 502 is capable of varying the injection strength in response to receiving power mode information 508. Variable injection-strength ILO 502 can include injection-strength controller 514 and ILO 510. Input clock signal 506 can be provided as input to ILO 510, which can produce output clock signal 504.

ILO 510 may receive free-run frequency control signal 516, which can be used to control the free-running frequency of an oscillation signal within ILO 510. The oscillation signal within ILO 510 can be perturbed based on input clock signal 506. The output from injection-strength controller 514 can be used to control the amplitude of the oscillation signal within ILO 510. Injection-strength controller 514 can decrease the amplitude of the oscillation signal within ILO 510 to operate ILO 510 under relatively strong injection, and increase the amplitude of the oscillation signal within ILO 510 to operate ILO 510 under relatively weak injection.

Figure 6:
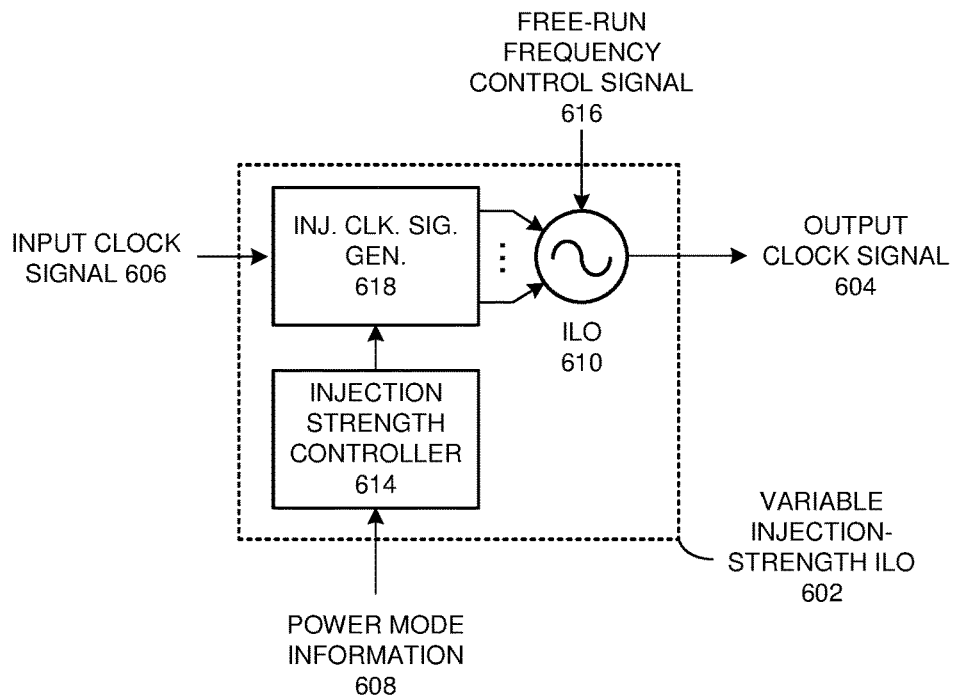
FIG. 6 illustrates a variable injection-strength ILO in accordance with some embodiments described in this disclosure.

FIG. 6 illustrates a variable injection-strength ILO in accordance with some embodiments described in this disclosure. Variable injection-strength ILO 602 is capable of varying the injection strength in response to receiving power mode information 608. Variable injection-strength ILO 602 can include injection-strength controller 614 and ILO 610. Input clock signal 606 can be provided as input to injection clock signal generator 618, which may output multiple copies of input clock signal 606 which may or may not have different phase delays. The multiple outputs from injection clock signal generator 618 may be provided as inputs at multiple injection points in ILO 610, which can produce output clock signal 604.

ILO 610 may receive free-run frequency control signal 616, which can be used to control the free-running frequency of an oscillation signal within ILO 610. The output from injection-strength controller 614 can be used to control the number of injection points in ILO 610 that are injected with an injection clock signal. Injection-strength controller 614 can increase the number of injection points to operate ILO 610 under relatively strong injection, and decrease the number of injection points to operate ILO 610 under relatively weak injection.

Figure 7A:
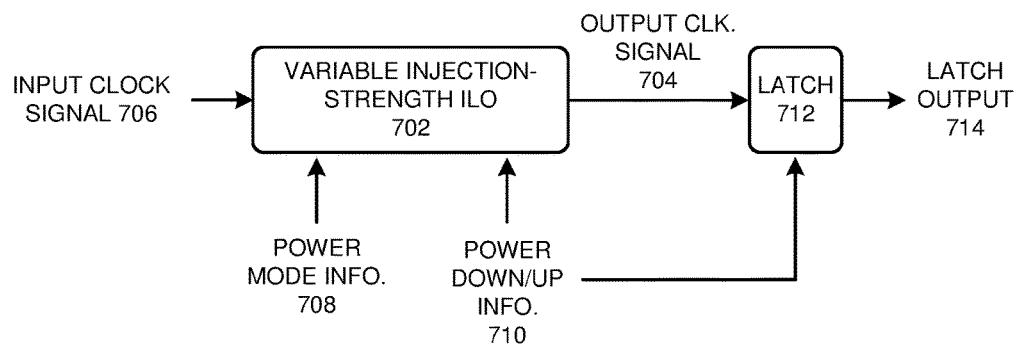
FIG. 7A illustrates a variable injection-strength ILO that is capable of being powered down during a power saving mode in accordance with some embodiments described in this disclosure.

FIG. 7A illustrates a variable injection-strength ILO that is capable of being powered down during a power saving mode in accordance with some embodiments described in this disclosure. Variable injection-strength ILO 702 outputs output clock signal 704 based on input clock signal 706. Variable injection-strength ILO 702 can receive power mode information 708 and power down/up information 710 (e.g., an enable/disable signal).

Latch 712 receives output clock signal 704 and produces latch output 714. When latch 712 is unlatched, it passes the input signal to its output, i.e., latch output 714 toggles synchronously with output clock signal 704. When latch 712 is latched, latch output 714 outputs the latched signal value. Latch 712 can be latched and unlatched based on power down/up information 710. When input clock signal 706 is toggling (e.g., in a normal power mode or a slow down mode), latch 712 is kept unlatched. Latch 712 may be latched after input clock signal 706 has been paused.

Figure 7B:
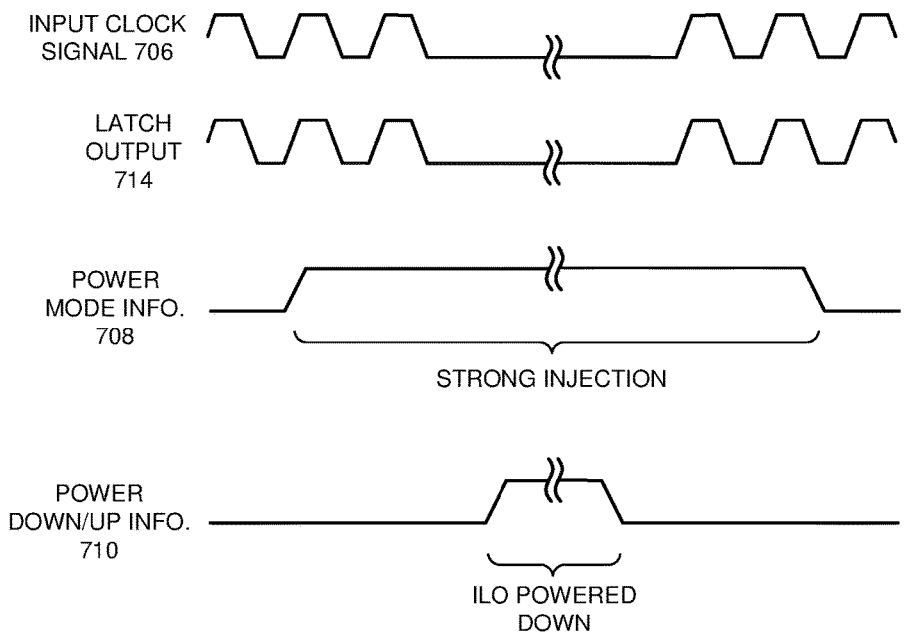
FIG. 7B illustrates waveforms associated with a variable injection-strength ILO that is capable of being powered down during a power saving mode in accordance with some embodiments described in this disclosure.

FIG. 7B illustrates waveforms associated with the system shown in FIG. 7A in accordance with some embodiments described in this disclosure. The waveforms shown in FIG. 7B are for illustration purposes only. As shown in FIG. 7B, variable injection-strength ILO 702 may receive power mode information 708 that indicates that a circuit is about to transition between two power modes, e.g., from a normal power mode to a power saving mode. In response, variable injection-strength ILO 702 may increase the injection strength so that the ILO operates under relatively strong injection. After power mode information 708 is received by variable injection-strength ILO 702, input clock signal 706 may pause. Since variable injection-strength ILO 702 is operating under relatively strong injection, output clock signal 704 pauses synchronously with respect to input clock signal 706. Next, power down/up information 710 may indicate that variable injection-strength ILO 702 is to be powered down. In response, the signal value of output clock signal 704 may be latched by latch 712, and then variable injection-strength ILO 702 may be powered down.

Subsequently, power down/up information 710 may indicate that variable injection-strength ILO 702 is to be powered up. In response, variable injection-strength ILO 702 may be powered up, and then latch 712 may be unlatched after the output of variable injection-strength ILO 702 has stabilized.

Next, input clock signal 706 may restart. Since variable injection-strength ILO 702 is operating under relatively strong injection, it restarts output clock signal 704 synchronously with respect to input clock signal 706. Further, since latch 712 is unlatched, latch output 714 outputs the output clock signal 704, which was restarted synchronously with respect to input clock signal 706. Variable injection-strength ILO 702 may then receive power mode information 708 that indicates that the circuit has entered a normal power mode. In response, variable injection-strength ILO 702 may decrease the injection strength so that the ILO operates under weak injection.

Figure 8:
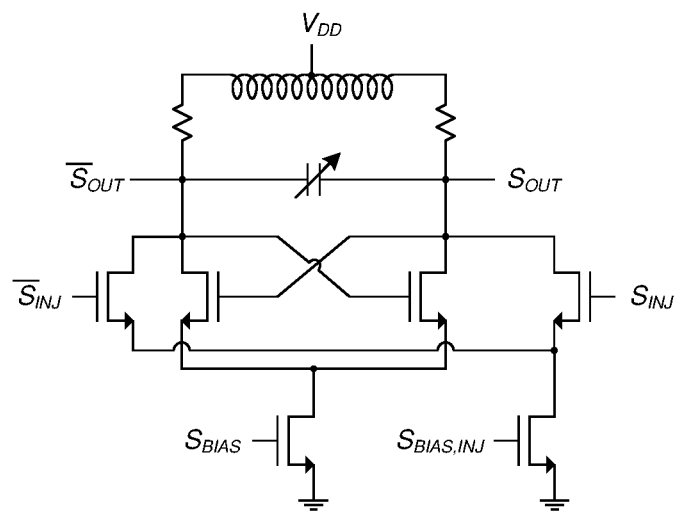
FIG. 8 illustrates a variable injection-strength ILO that includes a tank circuit (i.e., an oscillator based on an inductance/capacitance pair) in accordance with some embodiments described in this disclosure.

FIG. 8 illustrates a variable injection-strength ILO that includes a tank circuit (i.e., an oscillator based on an inductance/capacitance pair) in accordance with some embodiments described in this disclosure. Signals $S_{INJ}$ and $\overline{S}_{INJ}$ correspond to the injection clock signal, signals $S_{OUT}$ and $\overline{S}_{OUT}$ correspond to the output clock signal, and $V_{DD}$ is the supply voltage. The amplitude of the ILO's oscillation signal can be changed by using bias signal $S_{BIAS}$. Specifically, the ILO can be operated under relatively strong injection by either increasing $S_{BIAS,INJ}$ (which, in turn, increases the amplitude of the injection clock signal) or by decreasing $S_{BIAS}$ (which, in turn, decreases the amplitude of the oscillator's signal). Conversely, the ILO can be operated under relatively weak injection by either decreasing $S_{BIAS,INJ}$ (which, in turn, decreases the amplitude of the injection clock signal) or by increasing $S_{BIAS}$ (which, in turn, increases the amplitude of the oscillator's signal). The free-running frequency of the LC oscillator can be changed by using the variable capacitor.

Figure 9:
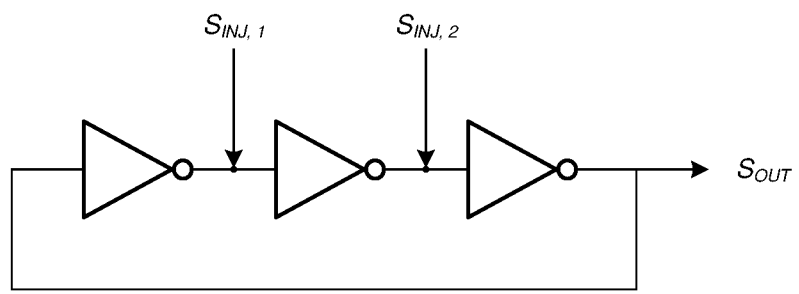
FIG. 9 illustrates a variable injection-strength ILO that includes a ring oscillator in accordance with some embodiments described in this disclosure.

FIG. 9 illustrates a variable injection-strength ILO that includes an inverter based ring oscillator in accordance with some embodiments described in this disclosure. Signal $S_{OUT}$ can correspond to the output clock signal and signals $S_{INJ,1}$ and $S_{INJ,2}$ can correspond to the injection clock signals that are injected at two different injection points. Note that the injection clock signals that are injected at the two injection points may have different phases. The ILO can be operated under relatively strong injection by injecting the injection clock signal at both injection points. The ILO can be operated under relatively weak injection by injecting the injection clock signal at only one of the two injection points. The ILO can be operated under relatively strong injection by injecting the injection clock signal at one or both injection points with a relatively low impedance (or high current) compared to the inverter device impedances (or currents). The ILO can be operated under relatively weak injection by injecting the injection clock signal at one or both injection points with a relatively high impedance (or low current) compared to the inverter device impedances (or currents). The ILO can be operated under relatively strong injection by increasing the impedance (or decreasing the drive current) of the inverters relative to the impedance (or drive current) of the injection signals. The ILO inverters can be tri-state inverters which have a high output impedance state, and the inverters can be configured into the high output impedance state to operate the ILO under relatively strong injection or into the normal impedance state to operate the ILO under relatively weak injection.

Figure 10:
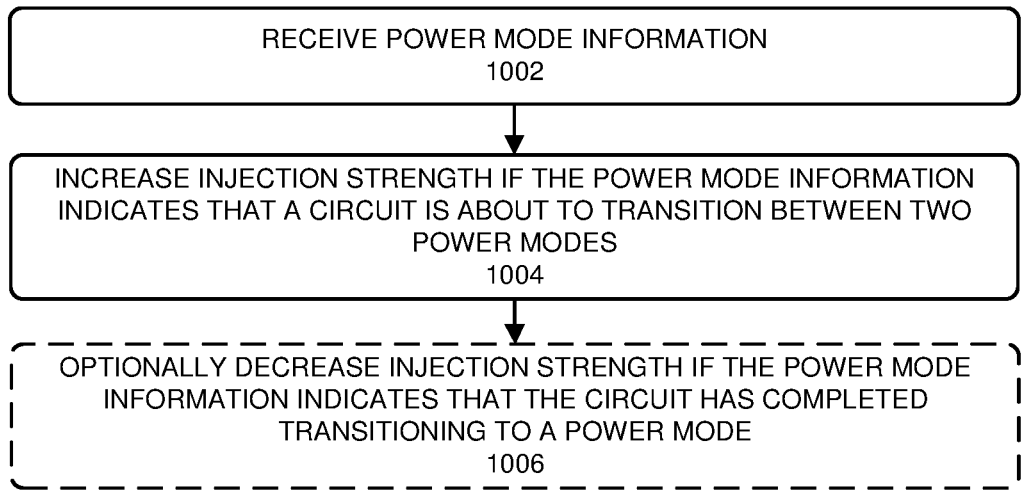
FIG. 10 presents a flowchart that illustrates a process for operating a variable injection-strength ILO in accordance with some embodiments described in this disclosure.

FIG. 10 presents a flowchart that illustrates a process for operating a variable injection-strength ILO in accordance with some embodiments described in this disclosure. A variable injection-strength ILO may receive power mode information (operation 1002). In response to receiving the power mode information, the variable injection-strength ILO can change the injection strength. Specifically, the variable injection-strength ILO can increase injection strength if the power mode information indicates that a circuit is about to transition between two power modes (operation 1004). The variable injection-strength ILO can optionally decrease injection strength if the power mode information indicates that a circuit has completed transitioning to a power mode (operation 1006). Specifically, if the performance requirements are such that the benefits of operating the ILO under relatively weak injection are not needed, then the ILO may continue to be operated under relatively strong injection even after the transition to the power mode has been completed.

Figure 11:
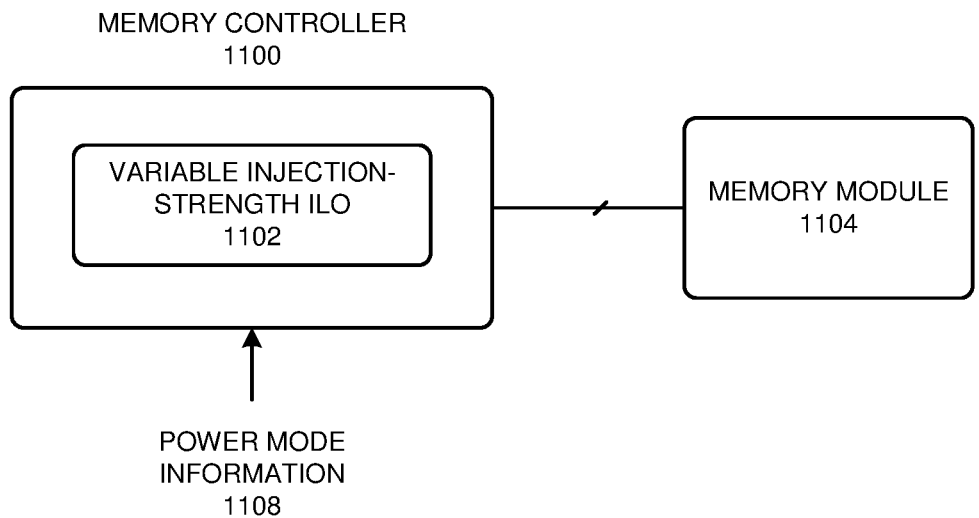
FIG. 11 illustrates a memory controller that includes a variable injection-strength ILO in accordance with some embodiments described in this disclosure.

FIG. 11 illustrates a memory controller that includes a variable injection-strength ILO in accordance with some embodiments described in this disclosure.

Memory controller 1100 may be coupled with memory module 1104 via one or more signal lines, which may carry control signals, clock signals, and/or data signals. Memory controller 1100 may receive power mode information 1108, and include one or more ILOs, such as, variable injection-strength ILO 1102. In some embodiments, memory controller 1100 may use variable injection-strength ILO 1102 to remove clock jitter, to de-skew clock signals, and/or to generate clock signals. In some embodiments, memory controller 1100 may change the injection strength of variable injection strength ILO 1102 based on power mode information 1108.

Any data structures and/or code described in this disclosure can be stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and/or processes described in this disclosure can be embodied as code and/or data, which can be stored in a computer-readable storage medium as described above. When a computer system reads and executes the code and/or data stored on the computer-readable storage medium, the computer system performs the methods and/or processes.

Furthermore, the methods and/or processes described in this disclosure can be embodied in hardware. Hardware embodiments include, but are not limited to, application-specific integrated circuit (ASIC) chips, field-programmable gate arrays (FPGAs), and other programmable-logic devices now known or later developed.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. A first circuit, wherein the first circuit generates an output clock signal that is used to clock a second circuit, the first circuit comprising:
   an amplifier to generate an adjusted input clock signal based on an input clock signal;
   an injection-locked oscillator (ILO) to generate an ILO output clock signal based on the adjusted input clock signal;
   a latch to output the output clock signal based on the ILO output clock signal; and
   a control circuit to (1) modify a gain of the amplifier based on power mode information associated with the second circuit, and (2) operate the latch based on enable/disable information associated with the ILO.

2. The first circuit of claim 1, wherein the control circuit increases the gain of the amplifier responsive to determining that the power mode information indicates that the second circuit is about to transition between two power modes.

3. The first circuit of claim 2, wherein increasing the gain of the amplifier causes the ILO output clock signal to pause synchronously with respect to the input clock signal when the input clock signal pauses.

4. The first circuit of claim 1, wherein the control circuit decreases the gain of the amplifier responsive to determining that the power mode information indicates that the second circuit has completed transitioning between two power modes.

5. The first circuit of claim 4, wherein decreasing the gain of the amplifier causes the ILO output clock signal to not pause synchronously with respect to the input clock signal when the input clock signal pauses.

6. The first circuit of claim 1, wherein the control circuit causes the latch to output a latched signal value responsive to the enable/disable information indicating that the ILO is about to be powered down.

7. The first circuit of claim 1, wherein the control circuit causes the latch to output the ILO output clock signal responsive to the enable/disable information indicating that the ILO has been powered up.

8. A memory controller, wherein the memory controller controls data flow to and from a memory device, the memory controller comprising:
   a first circuit and a second circuit, wherein the first circuit generates an output clock signal that is used to clock the second circuit; and
   wherein the first circuit comprises:
      an amplifier to generate an adjusted input clock signal based on an input clock signal;
      an injection-locked oscillator (ILO) to generate an ILO output clock signal based on the adjusted input clock signal;
      a latch to output the output clock signal based on the ILO output clock signal; and
      a control circuit to (1) modify a gain of the amplifier based on power mode information associated with the second circuit, and (2) operate the latch based on enable/disable information associated with the ILO.

9. The memory controller of claim 8, wherein the control circuit increases the gain of the amplifier responsive to determining that the power mode information indicates that the second circuit is about to transition between two power modes.

10. The memory controller of claim 9, wherein increasing the gain of the amplifier causes the ILO output clock signal to pause synchronously with respect to the input clock signal when the input clock signal pauses.

11. The memory controller of claim 8, wherein the control circuit decreases the gain of the amplifier responsive to determining that the power mode information indicates that the second circuit has completed transitioning between two power modes.

12. The memory controller of claim 11, wherein decreasing the gain of the amplifier causes the ILO output clock signal to not pause synchronously with respect to the input clock signal when the input clock signal pauses.

13. The memory controller of claim 8, wherein the control circuit causes the latch to output a latched signal value responsive to the enable/disable information indicating that the ILO is about to be powered down.

14. The memory controller of claim 8, wherein the control circuit causes the latch to output the ILO output clock signal responsive to the enable/disable information indicating that the ILO has been powered up.

15. A method, comprising:
   generating, by using an amplifier, an adjusted input clock signal based on an input clock signal;
   generating, by using an injection-locked oscillator (ILO), an ILO output clock signal based on the adjusted input clock signal;
   outputting, by using a latch, an output clock signal based on the ILO output clock signal;

modifying a gain of the amplifier based on power mode information associated with a circuit that is clocked by the output clock signal; and operating the latch based on enable/disable information associated with the ILO.

16. The method of claim 15, wherein said modifying the gain of the amplifier comprises increasing the gain of the amplifier responsive to determining that the power mode information indicates that the circuit is about to transition between two power modes.

17. The method of claim 16, wherein said increasing the gain of the amplifier causes the ILO output clock signal to pause synchronously with respect to the input clock signal when the input clock signal pauses.

18. The method of claim 15, wherein said modifying the gain of the amplifier comprises decreasing the gain of the amplifier responsive to determining that the power mode information indicates that the circuit has completed transitioning between two power modes.

19. The method of claim 18, wherein said decreasing the gain of the amplifier causes the ILO output clock signal to not pause synchronously with respect to the input clock signal when the input clock signal pauses.

20. The method of claim 15, wherein said operating the latch comprises:

outputting a latched signal value responsive to the enable/disable information indicating that the ILO is about to be powered down; and outputting the ILO output clock signal responsive to the enable/disable information indicating that the ILO has been powered up.

* * * * *